(12) United States Patent
Kinouchi et al.

(10) Patent No.: US 6,172,424 B1
(45) Date of Patent: Jan. 9, 2001

(54) RESIN SEALING TYPE SEMICONDUCTOR DEVICE

(75) Inventors: Kan Kinouchi, Okazaki; Yukihiro Kato, Kariya; Hiroshi Nomura, Nagoya; Michitake Kuroda, Ama-gun, all of (JP)

(73) Assignee: Denso Corporation, Kariya (JP)

( * ) Notice: Under 35 U.S.C. 154(b), the term of this patent shall be extended for 0 days.

(21) Appl. No.: 08/947,866

(22) Filed: Oct. 9, 1997

(30) Foreign Application Priority Data

Oct. 11, 1996 (JP) .................................................. 8-269989

(51) Int. Cl.⁷ .................................................. H01L 23/48
(52) U.S. Cl. ............................ 257/787; 257/723; 257/730
(58) Field of Search ................................. 257/787, 667, 257/723, 730

(56) References Cited

U.S. PATENT DOCUMENTS

| | | | | |
|---|---|---|---|---|
| 4,554,126 | * | 11/1985 | Sera | 264/272.17 |
| 4,697,203 | * | 9/1987 | Sakai et al. | 357/72 |
| 5,264,393 | * | 11/1993 | Tamura et al. | 437/209 |
| 5,328,552 | | 7/1994 | Benzoni | 156/630 |
| 5,424,249 | * | 6/1995 | Ishibashi | 437/211 |
| 5,523,608 | | 6/1996 | Kitaoka et al. | |
| 5,594,282 | * | 1/1997 | Otsuki | 257/796 |

FOREIGN PATENT DOCUMENTS

| | | |
|---|---|---|
| 0 322 122 | 6/1989 | (EP) . |
| 2103917 | 3/1972 | (FR) . |
| 61-271859 | 12/1986 | (JP) . |
| 3-1560 | 1/1991 | (JP) . |

* cited by examiner

*Primary Examiner*—Roy Potter
(74) *Attorney, Agent, or Firm*—Pillsbury Madison & Sutro LLP

(57) ABSTRACT

In order to form a hollow portion in a resin block after a molding operation, a projection for forming a hollow portion in a resin block is formed on an upper die. A front face of the projection is processed into a mirror finished face (smoothed flat face). Recess portions are formed in the front face of the projection. The position of the recess portions correspond to wire bonding regions of a lead frame. The lead frame is clamped between an upper die and a lower die. A molding resin is injected into a space between the upper and lower dies. As a result, an excellent wire bonding face can be secured at regions on the lead frame in correspondence with the recess portions.

14 Claims, 10 Drawing Sheets

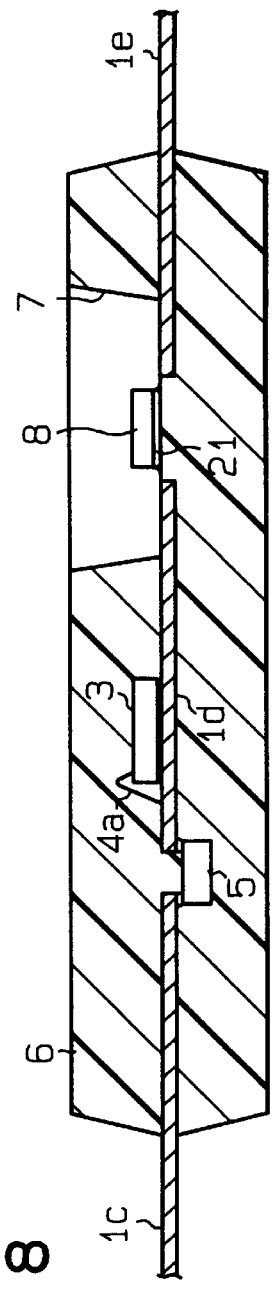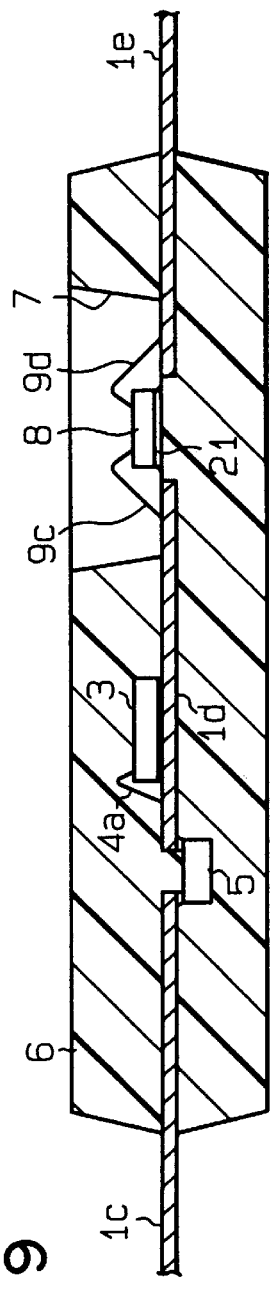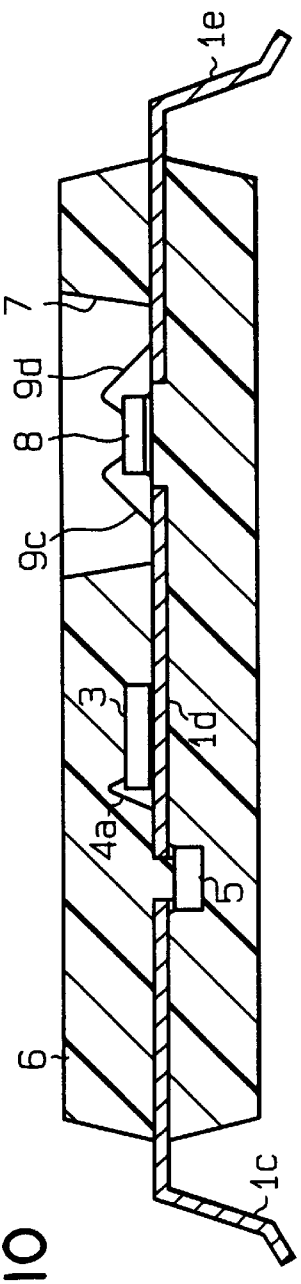

RESIN SEALING TYPE SEMICONDUCTOR DEVICE

CROSS REFERENCE TO RELATED APPLICATION

This application is based upon and claims the benefit of priority of prior Japanese Patent Application No. H. 8-269989 filed on Oct. 11, 1996, the contents of which are incorporated herein by reference.

BACKGROUND OF THE INVENTION

1. Field of the Invention

The present invention relates to a method of fabricating a resin sealing type semiconductor device and a die assembly for fabricating the resin sealing type semiconductor device.

2. Description of Related Art

As shown by FIG. 18, in respect of a molded IC, that is, a resin sealing type semiconductor device which is sealed by a transfer molding process using a molding resin, when there is an element 43 which cannot be sealed by the resin block 40, the element 43 is arranged at a hollow portion 41 of the molded resin block 40. A lead frame 42 exposed to the hollow portion 41 and the element 43 are connected through wire bonding.

In that case, the following drawbacks may generally occur by which wire bonding may not be favorably carried out.

(A) Burrs of the molding resin adhere onto the exposed lead frame 42 after forming the molded resin block 40 by which wire bonding cannot favorably be performed.

(B) A die for forming the molded resin block 40 is brought into direct contact with the lead frame 42 during a molding operation. Therefore, a release agent adhered to the die is transferred to the lead frame 42 by which wire bonding cannot favorably be performed.

(C) The lead frame 42 is harmed since the die is brought into direct contact with the lead frame 42 in the molding operation by which excellent wire bonding cannot be performed.

In order to resolve the drawbacks as described above, the following techniques have been known.

(A) Favorable wire bonding regions are secured on the lead frame 42 by removing the burrs of the molding resin on the lead frame 42 and cleaning the release agent thereon after the molding operation as disclosed in, for example, Japanese Patent Application Laid-Open No. 6-85222.

(B) A protective film is previously formed at the wire bonding region on the lead frame 42 and the protective film is removed by etching after the molding operation thereby securing the excellent wire bonding region on the lead frame 42 as disclosed in, for example, Japanese Patent Application Laid-Open No. 6-302744.

However, when such a method is used, addition of steps is needed which gives rise to an increase in cost.

SUMMARY OF THE INVENTION

Hence, it is an object of the present invention to secure an excellent wire bonding region on a lead frame without causing an increase in fabricating cost due to the addition of steps or the like.

According to the present invention, a lead frame is clamped by a die in a state where the die is in non-contact with the lead frame in a wire bonding region of a lead frame and the wire bonding region is separated from a space to be injected with molding resin. Under this state, the molding resin is injected into the space formed in the die assembly.

Therefore, the excellent wire bonding region can be secured on the lead frame without removing burrs of the molding resin, cleaning a release agent, or forming and removing a protective film at the wire bonding region on the lead frame after a molding operation. As a result, because there is no need of addition of steps for securing the excellent wire bonding region, an increase in fabricating cost can be avoided.

It is preferable that a contact portion of the die which makes contact with the lead frame in a region for forming the hollow portion is formed to project toward the lead frame side more than contact portions of the die contacting with the lead frame in regions other than the region for forming the hollow portion. In this case, the contact portion of the die which makes contact with the lead frame in the region for forming the hollow portion is applied with pressing force by the length of projection. Therefore, the region for forming the hollow portion can favorably be sealed by the contact portion of the die.

If a film for promoting a sealing performance between the contact portion and the lead frame is formed on the surface of the lead frame, the sealing performance can be promoted by the amount of squashing the film.

When the film for promoting the sealing performance is constituted by a plated layer, the film for promoting the sealing performance can be also used as an under film utilized in carrying out wire bonding.

To clamping the lead frame by the die in a state where the die is in non-contact with the lead frame in the wire bonding region of the lead frame, a die having a recess portion or a through hole which opens to the wire bonding region on the lead frame can be used.

When a surface of the contact portion of the die contacting with the lead frame in the region for forming the hollow portion is processed into a smoothed flat surface, the sealing performance between the contact portion and the lead frame is enhanced.

The die has a first die and a second die which sandwich a lead frame. In this case, it is preferable that the first die has a projection for forming a hollow portion that is in contact with the surface of the lead frame and the second die also has a projection that is in contact with the rear surface of the lead frame at least in a wire bonding region on the lead frame. According to this structure, the sealing performance at the contact portion of the first die around the recess portion or the through hole in the first die is preferably promoted.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIGS. 3 through 13 are sectional views for explaining fabrication steps of the molded IC;

DETAILED DESCRIPTION OF THE PREFERRED EMBODIMENTS (First Embodiment)

A description will be given of a first embodiment of the present invention with reference to the drawings.

Figure 1:
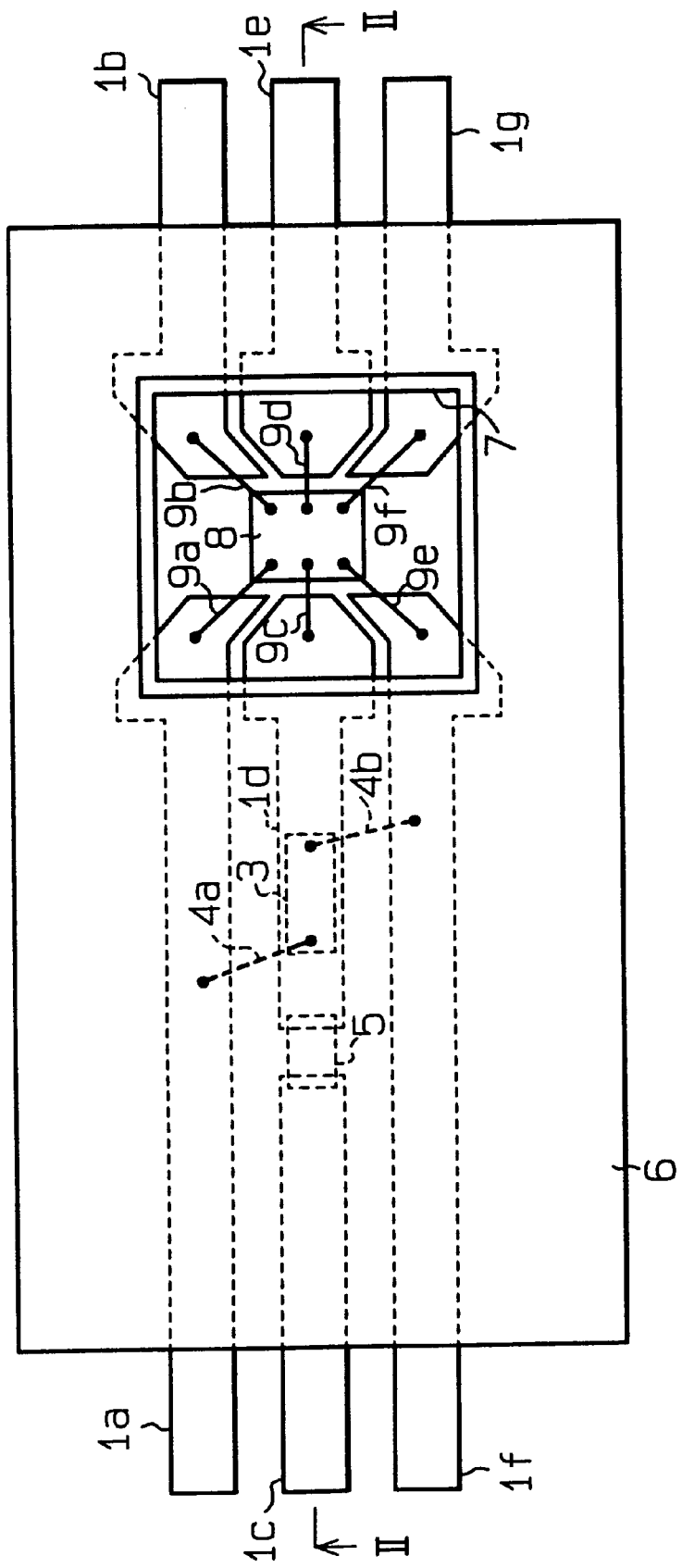
FIG. 1 is a plane view of a molded IC according to a first embodiment.
Figure 2:
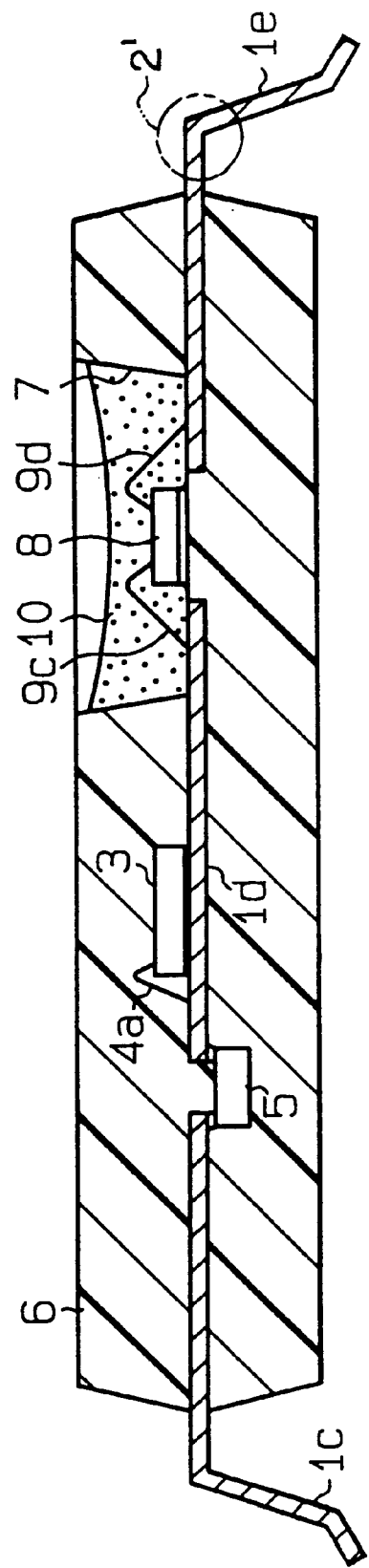
FIG. 2 is a sectional view taken along a line II—II of FIG. 1.
Figure 2A:
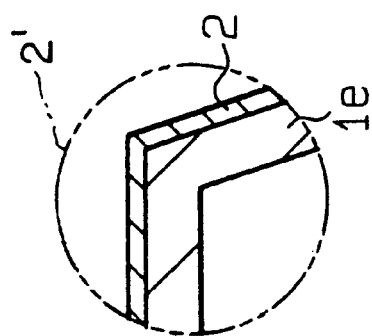
FIG. 2A is an enlarged view of a portion of FIG. 2.

FIG. 1 is a plane view of a molded IC and FIG. 2 is a sectional view taken along a line II—II of FIG. 1. According to the embodiment, the invention is embodied in a pressure sensor for measuring atmospheric pressure.

Lead frames (metal plates) 1a, 1b, 1c, 1d, 1e, 1f, and 1g are made of 42-alloy and their thickness is 250 $\mu$m. As shown by FIG. 2, a plated layer 2 necessary for wire bonding is formed on surfaces of the lead frames 1a through 1g. More specifically, the plated layer 2 is a plated layer of Au (gold) having a thickness of 1 through 5 $\mu$m. The lead frames 1a through 1g may be made of Cu (copper). Further, the plated layer 2 may be an Ag plated layer, an Ni plated layer, an Ag/Ni plated layer or an Au/Ni plated layer. However, the plated layer 2 need not necessarily be formed at all the areas of the lead frames 1a through 1g but may be formed only at portions where wire bonding is to be carried out.

An IC chip 3 is mounted on an upper face (main surface) of the lead frame 1d. The IC chip 3 is electrically connected to the lead frames 1a and 1f by bonding wires 4a and 4b, respectively. Au (gold) wires or Al (aluminum) wires are used for the bonding wires 4a and 4b. A condenser chip 5 is mounted on lower faces (rear faces) of the lead frames 1c and 1d. The chip 5 is electrically connected to the lead frames 1c and 1d. The lead frames 1a through 1g as well as the IC chip 3, the bonding wires 4a and 4b and the condenser chip 5 are molded by a resin (epoxy family thermosetting resin) 6.

A hollow portion 7 where the molding resin 6 is not formed is constituted at a predetermined region on the upper faces of the lead frames 1a through 1g. A pressure sensor chip 8 is mounted on the bottom face of the hollow portion 7. End portions of the lead frames 1a, 1b, 1d, 1e, 1f and 1g are exposed at the bottom face of the hollow portion 7. The pressure sensor chip 8 and the exposed lead frames 1a, 1b, 1d, 1e, 1f and 1g are electrically connected by bonding wires 9a, 9b, 9c, 9d, 9e and 9f. Au (gold) wires or Al (aluminum) wires are used for the wires 9a through 9f. Silicone gel 10 as a protective material is applied inside of the hollow portion 7. The sensor chip 8 and the bonding wires 9a through 9f are shielded from outside air by the silicone gel 10. The pressure sensor chip 8 converts pressure applied thereto into electric signal. Signal processing such as amplification or the like is executed by the IC chip 3 and the condenser chip 5.

Next, a description will be given of fabrication steps of the semiconductor device (the molded IC) constituted as described above with reference to FIG. 2 through FIG. 10.

Figure 3:
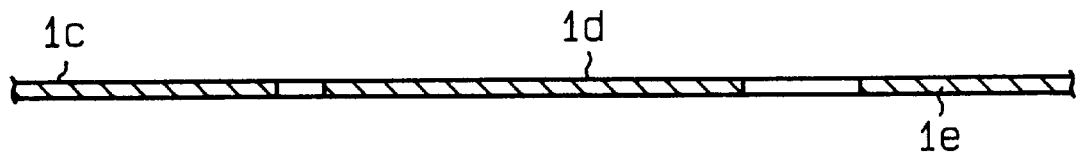

First, as shown by FIG. 3, lead frames 1a through 1g having the Au plated layer 2 on their surfaces are prepared. Multi series of lead frames are prepared in order to fabricate a plurality of pressure sensors.

Figure 4:
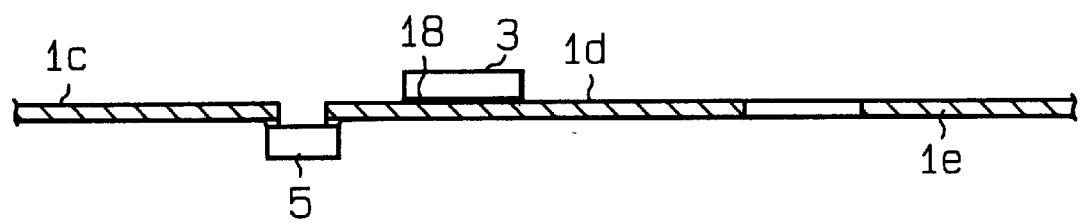

Next, as shown by FIG. 4, a necessary amount of an epoxy family die bonding material 18 is coated on the lead frame 1d by a dispenser or by stamping. The IC chip 3 is mounted on the epoxy family die bonding material 18. Thereafter, the die bonding material 18 is cured. The condenser chip 5 is mounted on the lead frames 1c and 1d.

Figure 5:
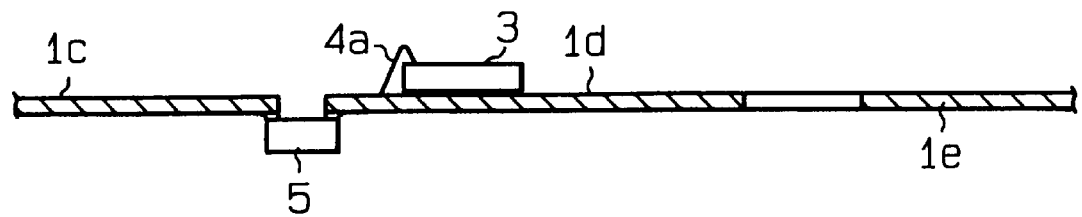

Successively, as shown by FIG. 5, wire bonding is performed by wires 4a and 4b whereby the IC chip 3 and the lead frames 1a and 1f are electrically connected.

Figure 6:
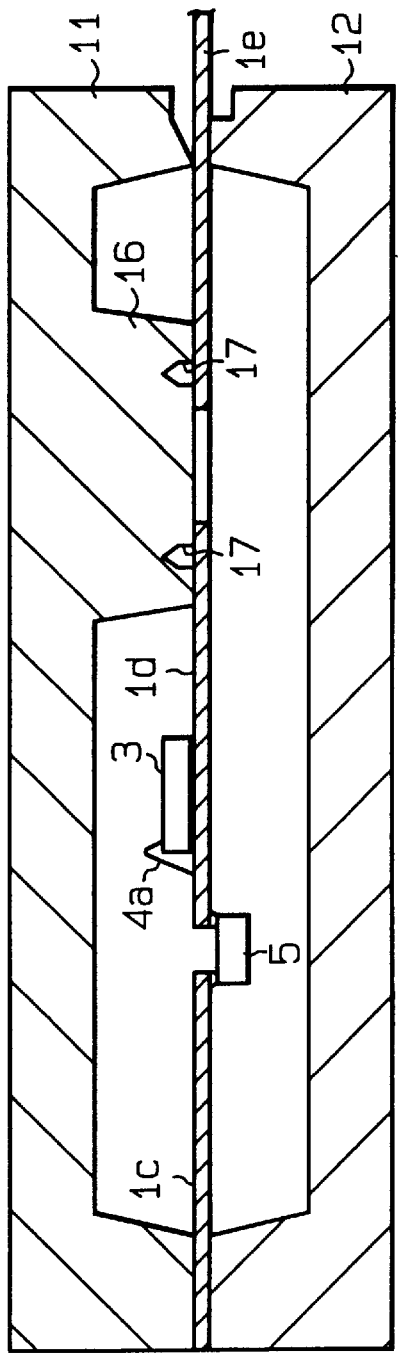
Figure 7:
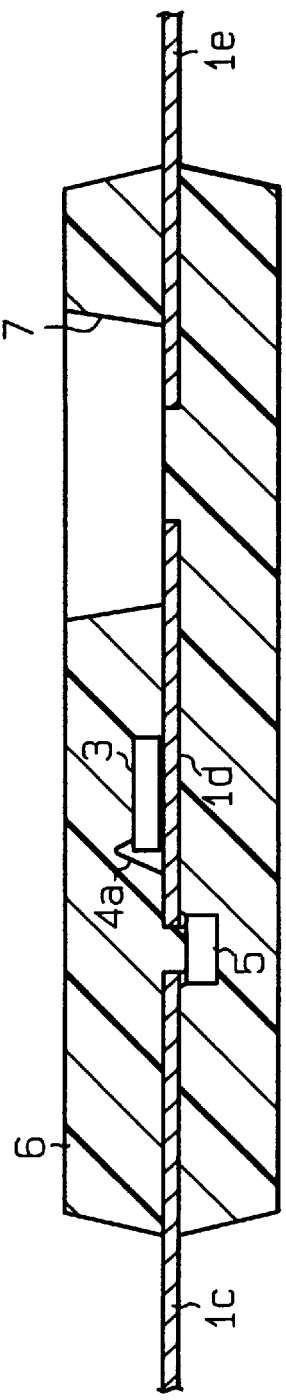

Next, as shown by FIG. 6, the lead frames 1a through 1g are sandwiched by upper and lower dies 11 and 12, that is the lead frames 1a through 1g are clamped by the upper and lower dies 11 and 12. Under this state, resin is injected into a space between the upper and lower dies 11 and 12 and molding operation is executed with use of resin 6 as shown by FIG. 7. A detailed explanation will be given of this step in reference to FIG. 11 through FIG. 13.

Figure 11:
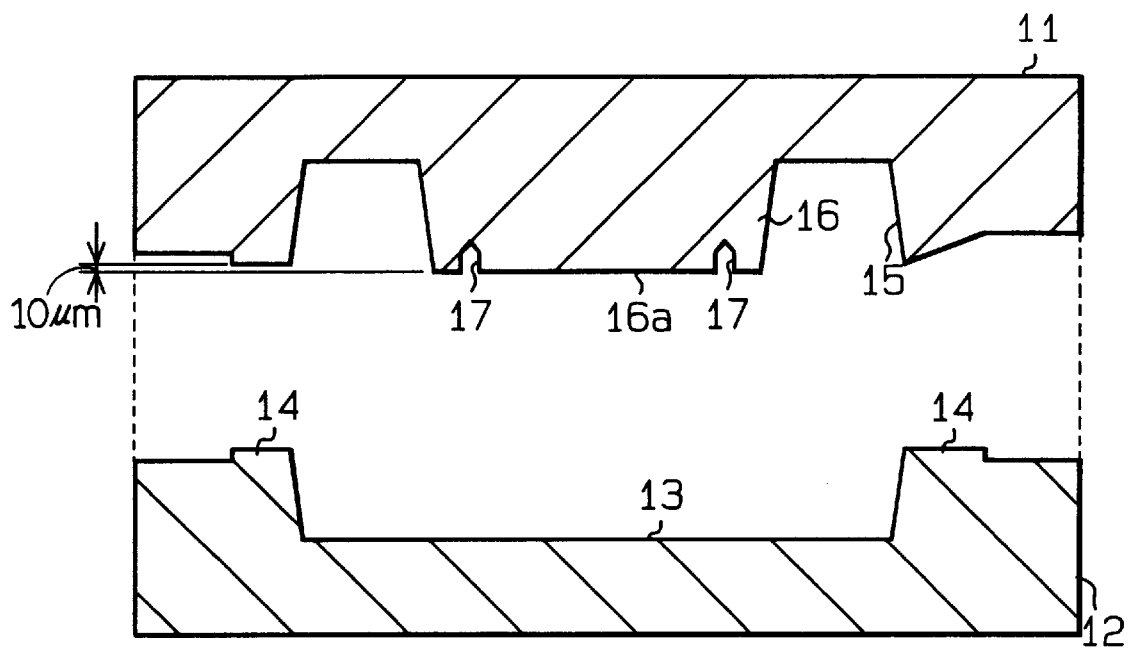

As shown by FIG. 11, the die comprises the upper die 11 and the lower die 12. A recess portion 13 is formed in the lower die 12 and a projected streak portion 14 is formed at the outer peripheral portion of the recess portion 13. Further, a recess portion 15 is formed in a ring-like shape in the upper die 11. A region surrounded by the recess portion 15 is one corresponding to the hollow portion 7 in FIG. 2, in this region there is formed a projection 16 for forming the hollow portion 7 in the upper die 11. A front face 16a of the projection 16 for forming the hollow portion 7 (lower face in FIG. 11) is smoothed by performing mirror-finish. More specifically, in respect of the surface roughness, Rz (10 points mean roughness) is equal to or less than 0.8 $\mu$m.

Further, the projection 16 for forming the hollow portion 7 is projected by 10 $\mu$m further than other regions of the upper die 11 which are in contact with the lead frames 1a through 1g. That is, the front face 16a of the projection 16 for forming the hollow portion 7 is extended downward from other regions of the upper die 11 which are in contact with the lead frames 1a through 1g (on the outer periphery of the recess portion 15 in FIG. 11) by 10 $\mu$m. Further, recess portions 17 are formed at the front face 16a of the projection 16 for forming the hollow portion 7. The positions of the recess portions 17 correspond to the wire bonding regions on the lead frames 1a through 1g.

Figure 12:
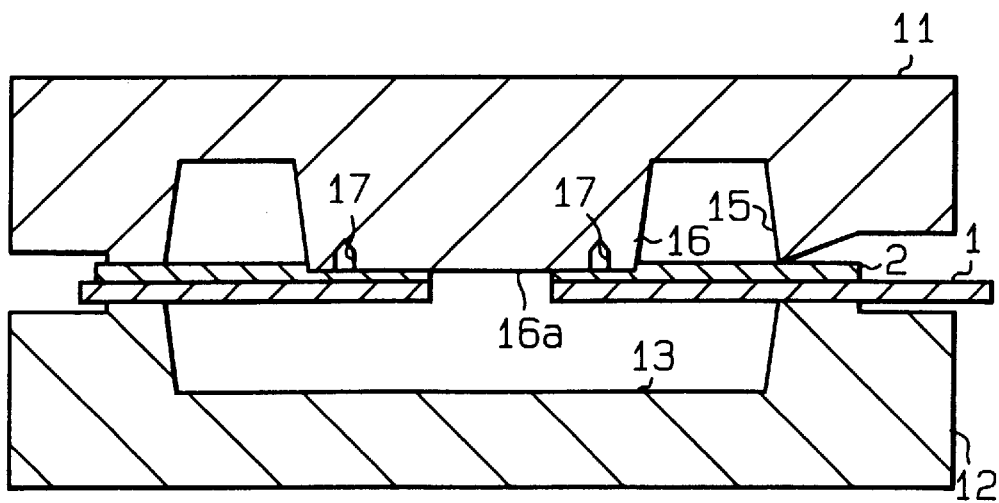

As shown by FIG. 12, the lead frames 1a through 1g are clamped between the upper die 11 and the lower die 12 set to a molding press machine. Under the clamped state, the excellent wire bonding regions on the lead frames 1a through 1g are secured by the recess portions (escape portion) 17 provided on the upper die 11. In this clamping operation, the projection 16 for forming the hollow portion 7 cuts into the plated layers 2 on the lead frames 1a through 1g. That is, the projection 16 for forming the hollow portion 7 cuts into the plated layers 2 without deforming the lead frames 1a through 1g since the front face 16a of the projection 16 for forming the hollow portion 7 is projected by 10 $\mu$m further than other faces of the upper die 11 which are in contact with the lead frames 1a through 1g. Closed spaces are formed between the lead frames 1a through 1g and the upper die 11 by the recess portions (escape portions) 17 in this way, by which the wire bonding regions of the lead frames 1a through 1g are protected.

Figure 13:
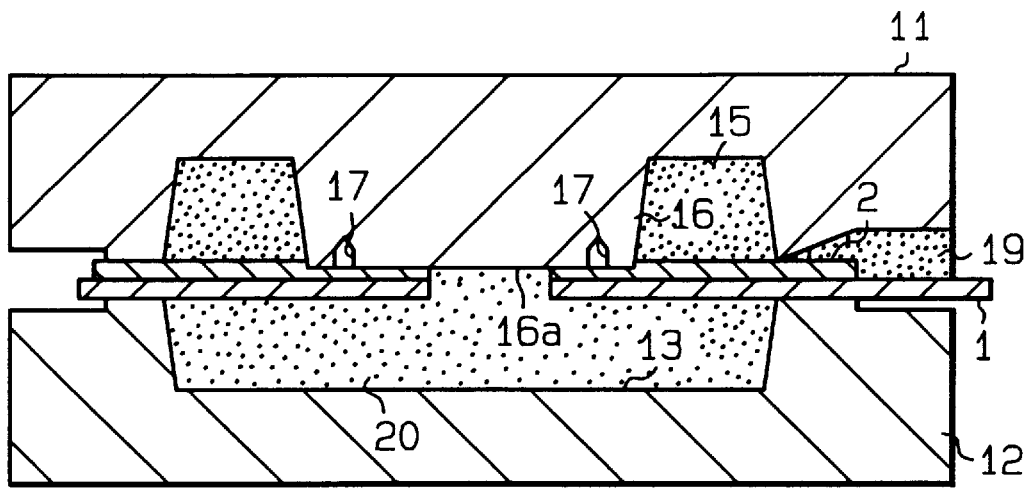

Subsequently, as shown by FIG. 13, molding resin (epoxy family thermosetting resin) 20 is injected from a resin injection port 19. The molding resin 20 is filled in the space between the upper and lower dies 11 and 12 under pressure (injecting pressure; 70 through 110 kg/cm$^2$). Therefore, flaw of the wire bonding regions, adhesion of the release agent on the lead frames and occurrence of resin burrs in the wire bonding regions can be prevented by the closed spaces formed by the recess portions (escape portions) 17, whereby the excellent wire bonding faces can be obtained on the lead frames. Further, after maintaining the pressurized state until the molding resin 20 is cured (specifically, one minute thirty seconds through 5 minutes), the upper and lower dies 11 and 12 are opened and a molded product is taken out. In this way, the molding operation shown by FIG. 7 is carried out.

Successively, as shown by FIG. 8, a necessary amount of an adhesive agent 21 is coated on the surface of the resin 6 at the bottom face of the hollow portion 7 by a dispenser or by stamping. The sensor chip 8 is mounted on the surface of the resin 6 through the adhesive agent 21 and the adhesive agent 21 is cured. In this way, mounting of the sensor chip 8 at the inside of the hollow portion 7 is carried out.

Next, as shown by FIG. 9, bonding of the wires 9a through 9f is carried out by which the sensor chip 8 and the wire bonding regions in the hollow portion 7 are connected by the wires 9a through 9f.

Further, as shown by FIG. 10, a lead-frame-like work (intermediate product) is set on a die for cutting and molding the lead frames. Due to the die, the lead frames 1a through 1g are cut for each sensor and the ends of the lead frames 1a through 1g are formed in the predetermined shape.

Thereafter, as shown by FIG. 2, coating of protective agent is carried out by injecting the silicone gel 10 into the hollow portion 7 by a dispenser.

In this way, the embodiment has the following characteristics.

(a) As shown by FIG. 12, by providing the recess portions 17 in the upper die 11, the lead frames 1a through 1g are clamped by the upper and lower dies 11 and 12 under the state in which portions of the upper die in correspondence with the wire bonding regions of the lead frames 1a through 1g are brought into non-contact with the lead frames 1a through 1g. From this state, as shown by FIG. 13, the molding resin 20 is injected into the space between the upper and lower dies 11 and 12.

Therefore, in clamping the lead frames 1a through 1g, closed spaces are formed by the recess portions (escape portions) 17 and the wire bonding regions of the lead frames 1a through 1g are kept in a non-contact state with the upper and lower dies 11 and 12. As a result, flaw of the wire bonding regions, adhesion of the release agent and occurrence of resin burr can be prevented and the excellent wire bonding face can be obtained. Due to this, it is not necessary to remove burrs of molding resin on the lead frames 1a through 1g or clean the release agent after the molding operation or to form and remove a protective film in the wire bonding regions of the lead frames 1a through 1g by which an increase in fabricating cost accompanied by additional steps can be avoided.

(b) As shown by FIG. 11, in respect of the upper die 11 the contact portion 16a making contact with the lead frames in the region for forming the hollow portion 7, is projected by 10 μm further than the contact portions of the upper die 11 which are in contact with other regions of the lead frames. Therefore, the contact portion 16a is applied with pressing force by the amount of projection. As a result, the region for forming the hollow portion 7 can excellently be sealed.

(c) The plated layer 2 as a film for promoting sealing performance is formed on the lead frames 1a through 1g. Therefore, as shown by FIG. 12, the sealing performance can be promoted by an amount of squashing the film.

(d) Because The film for promoting the sealing performance is the plated layer 2, the film can be also used as an under layer for wire bonding.

(e) The contact face 16a of the projection 16 making contact with the lead frames in the region for forming the hollow portion 7, is processed into a smoothed flat face (mirror finished face). As a result, the sealing performance of the contact portion 16a to the lead frames is promoted.

(Second Embodiment)

Next, a description will be given of a second embodiment concentrating on a difference thereof from the first embodiment.

Figure 14A:
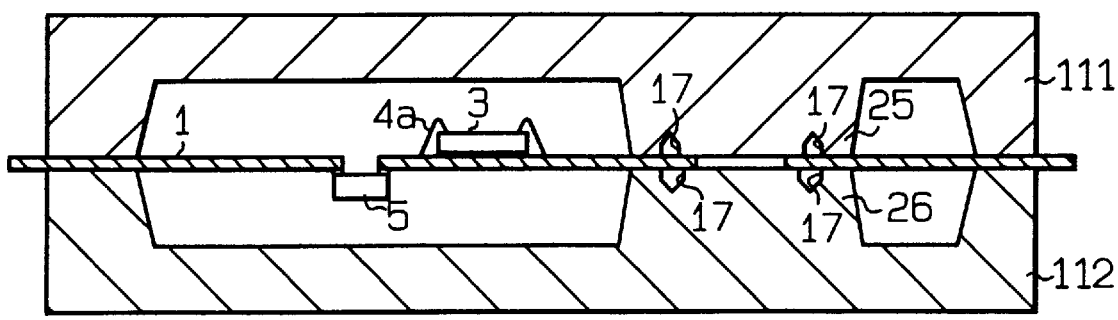
FIGS. 14A and 14B are sectional views for explaining a molded IC according to a second embodiment.
Figure 14B:
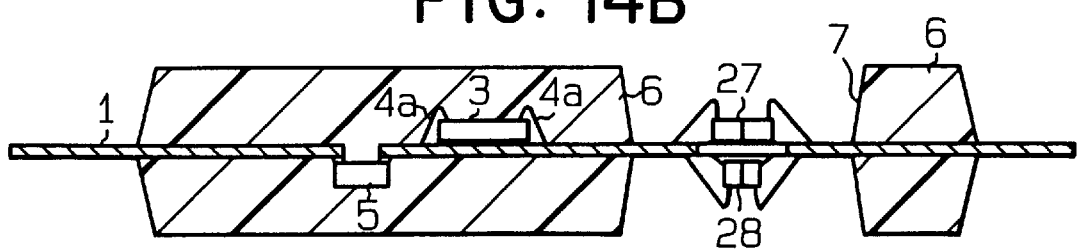

According to the second embodiment, as shown by FIG. 14A, a projection 25 for forming the hollow portion having the recess portions 17 is provided in the upper die 111 and a projection 26 for forming the hollow portion having the recess portions 17 is provided in the lower die 112. In this case, as shown by FIG. 14B, a molded IC of both face mounted type in which chips 27 and 28 are mounted on both of the upper face and the lower face of the lead frame 1 is formed.

(Third Embodiment)

Next, a description will be given of a third embodiment concentrating on a difference thereof from the first embodiment.

Figure 15A:
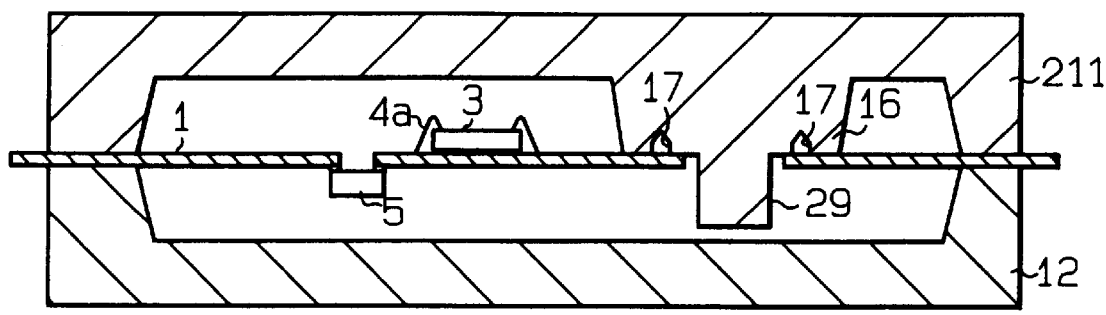
FIGS. 15A and 15B are sectional views for explaining a molded IC according to a third embodiment.
Figure 15B:
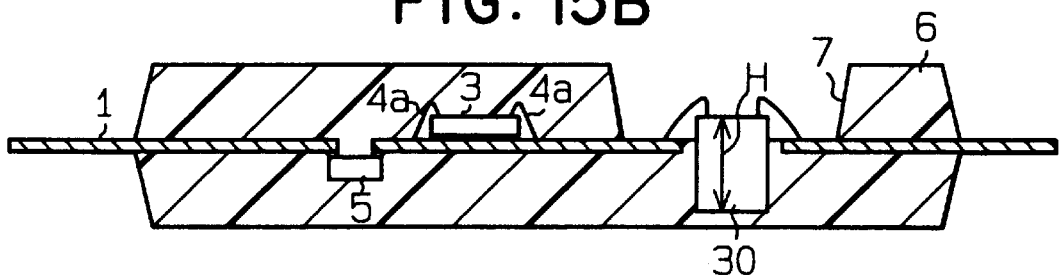

As shown by FIG. 15A, a projection 29 is formed at the front face 16a of the projection 16 for forming the hollow portion in the upper die 211. By performing molding operation with use of this upper die 211, as shown by FIG. 15B, a chip 30 having a large height H can be is installed in the hollow portion 7. That is to say, the bottom face of the chip 30 is disposed at a position lower than the height of the lead frame 1. The third embodiment is applicable to a molded IC of fitting hole type.

(Fourth Embodiment)

Next, a description will be given of a fourth embodiment concentrating on a difference thereof from the first embodiment.

Figure 16A:
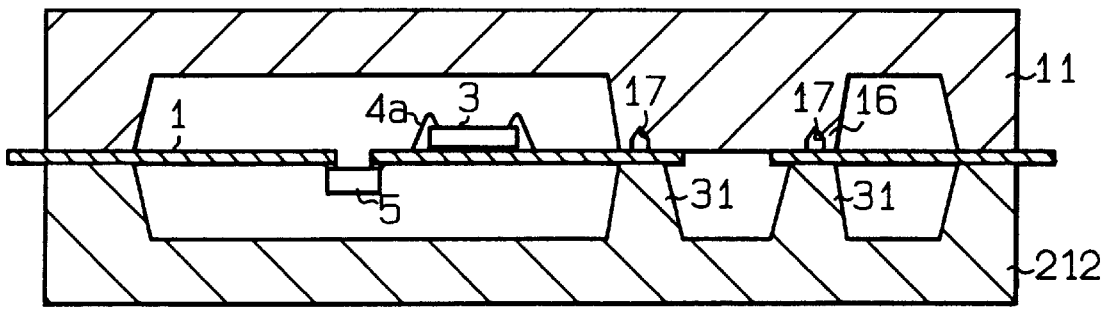
FIGS. 16A and 16B are sectional views for explaining a molded IC according to a fourth embodiment.

As shown by FIG. 16A, a projection 16 for forming the hollow portion that is in contact with the surface of the lead frame 1 is formed at the upper die 11. Projections 31 that are brought into contact with the rear faces of the lead frames 1a through 1g at least in wire bonding regions are formed at the lower die 212. In clamping the lead frame 1 by the dies 11 and 212, the sealing is not performed only by the rigidity of the lead frames 1 but by the biasing force applied to the lead frame 1 from the upper and lower dies 11 and 211. That is, wire bonding regions of the lead frames 1 are supported by the projections 31 of the lower die 212. Consequently, the sealing performance is promoted and there is no concern of leaking of resin.

Figure 16B:
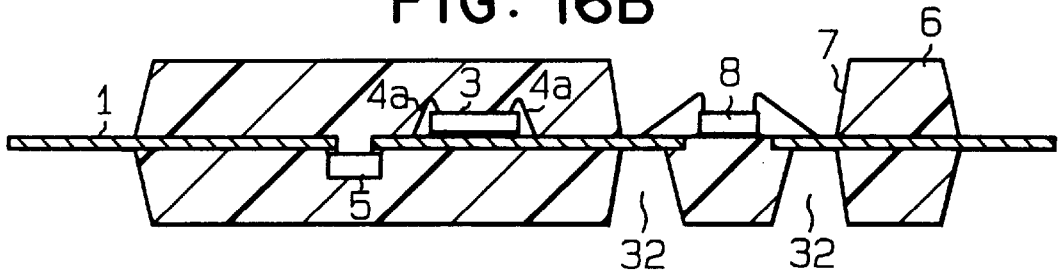

In the molded IC after the molding operation, as shown by FIG. 16B, spaces 32 are formed at regions in correspondence with the projections 31.

In this way, the embodiment has the following characteristics.

(a) The projections 31 which are brought into contact with the rear face of the lead frame 1 at least in the wire bonding regions are formed at the lower die (second die) 212 in correspondence with the projection 16 for forming the hollow portion in the upper die (first die) 11. The sealing performance at the contact portion around the recess portions 17 can be promoted.

Figure 17A:
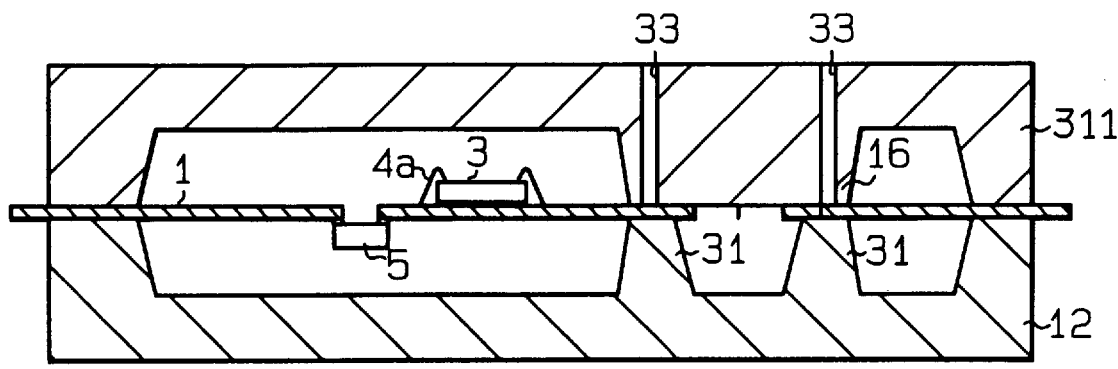
FIGS. 17A and 17B are sectional views for explaining a molded IC according to a modification of the fourth embodiment.
Figure 17B:
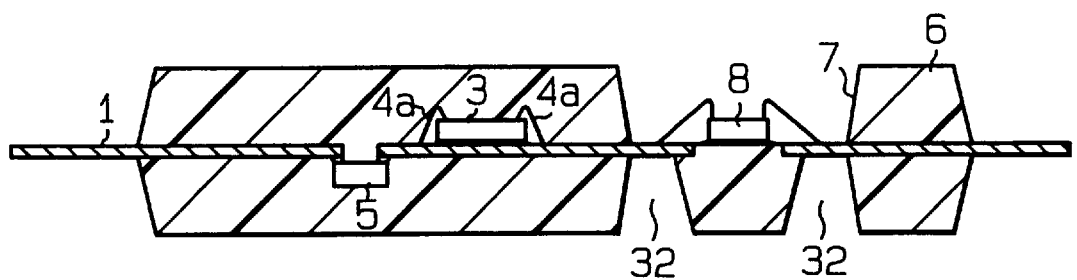
Figure 18:
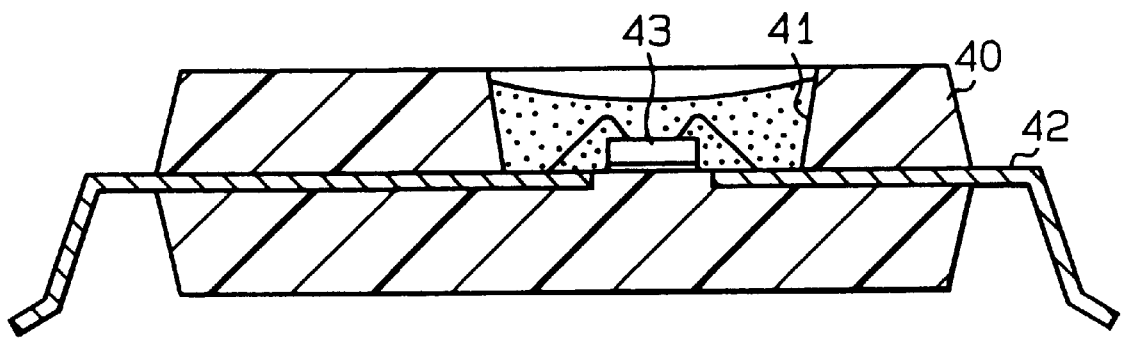
FIG. 18 is a sectional view for explaining a conventional molded IC.

In this embodiment, as shown by FIG. 17A, through holes 33 penetrating the upper die 311 may be used in place of the recess portions 17 of FIG. 16A. The molded IC as shown by FIG. 17B similar to the molded IC shown by FIG. 16B can be fabricated even when the die 311 having the through holes 33 is used.

Other than the pressure sensor for measuring the atmospheric pressure as the resin sealing type semiconductor device, the present invention is applicable to a pressure sensor for measuring hydraulic pressure as well as an optical sensor, an acceleration sensor and the like.

Further, the present invention is applicable to a semiconductor device where no element is present in the hollow portion 7 and only the wire bonding is performed.

What is claimed is:

1. A resin molding die for fabricating a resin sealing type semiconductor device in which a lead frame is molded by a resin block, a hollow portion is formed in said resin block to expose a part of said lead frame therethrough, and a wire is bonded on the part of said lead frame exposed through said hollow portion, said die comprising;

either one of a recess portion and a through hole which opens to a wire bonding region of said lead frame provided at a projection portion for forming said hollow portion.

2. The resin molding die according to claim 1, including a first contact portion of said resin molding die which makes contact with said lead frame in a region of said resin molding die for forming said hollow portion, said first contact surface being formed to project toward said lead frame further than second contact portions of said resin molding die contacting with said lead frame in regions other than said region for forming said hollow portion.

3. The resin molding die according to claim 1, wherein a surface of said contact portion of the resin molding die which makes contact with said lead frame in said region for forming said hollow portion is processed in to a smoothed flat surface.

4. The resin molding die according to claim 1, wherein a surface of said resin molding contact portion of said die which makes contact with said lead frame in said region for forming said hollow portion is processed into a mirror finished surface.

5. The resin molding die according to claim 1, wherein said resin molding die has a first die and a second die to sandwich said lead frame therebetween, said first die has a projection for forming said hollow portion that is in contact with a main surface of said lead frame and said second die has a projection that is in contact with a rear surface of said lead frame at least in a wire bonding region of said lead frame.

6. A resin molding die for fabricating a resin sealing type semiconductor device in which a lead frame is molded by a resin block having a hollow portion therein to expose a part of said lead frame therethrough, and a wire is bonded on the part of said lead frame exposed through said hollow portion, said resin molding die comprising:

a main recess portion for being filled with a resin to form said resin block; and a projection portion for contacting with said lead frame to form said hollow portion of said resin block, and having a non-contact portion, not contacting with said lead frame at a portion facing a wire bonding region of said lead frame, at which the wire is to be bonded.

7. A resin molding die according to claim 6, wherein said non-contact portion forms a separated space separated from said main recess with a surface of said lead frame when said projection portion contacts with said lead frame.

8. A resin molding die according to claim 6, wherein said non-contact portion of said projection portion is either one of a sub recess portion and a through hole which opens to the wire bonding region.

9. A resin molding die according to claim 6, further comprising a contact portion to be contacted with said lead frame at a portion of said lead frame other than a portion of said lead frame to be contacted with said projection portion, wherein said projection portion projects further than said contact portion.

10. A resin molding die according to claim 6, wherein a surface of said projection portion, except for said non-contact portion, is processed into a smoothed flat surface.

11. A resin molding die according to claim 6, wherein a surface of said projection portion, except for said non-contact portion, is processed into a mirror finished surface.

12. A resin molding die according to claim 6, wherein the resin molding die comprises:

a first die having part of said main recess portion and said projection portion, and a second die having a remainder of said main recess portion to sandwich said lead frame with said first die.

13. A resin molding die according to claim 12, wherein said second die has a supporting projection portion to be contacted with a rear surface of said wire bonding region of said lead frame.

14. A resin molding die according to claim 12, wherein said second die has a supporting projection portion to be contacted with a rear surface of said lead frame at a portion thereof corresponding to said non-contact portion of said projection portion of said first die.

* * * * *